United States Patent
Honarparvar et al.

(10) Patent No.: US 12,301,238 B1
(45) Date of Patent: May 13, 2025

(54) METHOD AND SYSTEM FOR BOOSTING THE SPEED OF A RING-BASED FREQUENCY DIVIDER

(71) Applicant: CIENA CORPORATION, Hanover, MD (US)

(72) Inventors: Mohammad Honarparvar, Stittsville (CA); Ahmed Mustafa, Kanata (CA); Naim Ben-Hamida, Ottawa (CA); Nahla Abouelkheir, Kanata (CA)

(73) Assignee: CIENA CORPORATION, Hanover, MD (US)

( * ) Notice: Subject to any disclaimer, the term of this patent is extended or adjusted under 35 U.S.C. 154(b) by 0 days.

(21) Appl. No.: 18/504,604

(22) Filed: Nov. 8, 2023

(51) Int. Cl.
 *H03K 5/00* (2006.01)
 *H03K 3/03* (2006.01)
 *H03K 19/20* (2006.01)

(52) U.S. Cl.
 CPC ....... *H03K 5/00006* (2013.01); *H03K 3/0315* (2013.01); *H03K 2005/00078* (2013.01); *H03K 19/20* (2013.01)

(58) Field of Classification Search
 CPC .. H03K 5/00006; H03K 3/0315; H03K 19/20; H03K 2005/00078; H03K 5/133; H03K 3/0322; H03K 5/135; H03L 7/091; H03L 7/093; H03L 7/0995; H03H 11/0422; H03H 19/004; H03H 11/1291; H03F 3/45475; H03F 3/45179; H03F 2203/45318; H03F 2203/45644; H03F 2203/45631; H03F 2200/294; H03F 1/3211; H03F 2200/408; H03F 1/26; H03F 3/45183; H03F 2203/45526; H03F 2200/36; H03F 2203/45138; H03F 1/42; H03F 2203/45468
 See application file for complete search history.

(56) References Cited

U.S. PATENT DOCUMENTS

| | | | | | |
|---|---|---|---|---|---|
| 5,420,547 | A | * | 5/1995 | Kikuchi | H03K 3/0315 331/57 |
| 6,404,277 | B1 | * | 6/2002 | Lee | H04B 1/28 327/552 |
| 12,119,791 | B2 | * | 10/2024 | Jussila | H03F 3/45475 |

(Continued)

OTHER PUBLICATIONS

"International Search Report and Written Opinion", Mailed Feb. 27, 2025.

(Continued)

*Primary Examiner* — John W Poos
(74) *Attorney, Agent, or Firm* — Guntin & Gust, PLC; Kenneth S. Kwan

(57) ABSTRACT

Aspects of the subject disclosure may include, for example, a frequency divider, comprising a plurality of delay devices arranged to receive input clocks and generate output clocks, wherein one or more of the delay devices comprises a first transconductance element configured to receive a first input and provide a first output, a second transconductance element configured to receive a second input and provide a second output, a first feedforward transconductance element that cross couples the first input and the second output, and a second feedforward transconductance element that cross couples the second input and the first output. Other embodiments are disclosed.

20 Claims, 9 Drawing Sheets

(56) References Cited

U.S. PATENT DOCUMENTS

| | | | |
|---|---|---|---|
| 2013/0314160 A1* | 11/2013 | Tsai | ........................ H03F 3/193 |
| | | | 330/253 |
| 2014/0320202 A1* | 10/2014 | Iyer | ..................... H03F 3/45183 |
| | | | 327/564 |
| 2022/0244755 A1 | 8/2022 | Wang | |
| 2023/0053023 A1* | 2/2023 | Zhang | ....................... H03F 1/42 |

OTHER PUBLICATIONS

Sun, et al., "A 1.25-GHz 0.35~μm Monolithic CMOS PLL Based on a Multiphase Ring Oscillator", Member, IEEE Journal of Solid-State Circuits, vol. 36, No. 6, Jun. 2001, 7 pages.

\* cited by examiner

METHOD AND SYSTEM FOR BOOSTING THE SPEED OF A RING-BASED FREQUENCY DIVIDER

FIELD OF THE DISCLOSURE

The subject disclosure relates to a speed boosting for a ring-based frequency divider.

BACKGROUND

The increasing demand for higher speed and higher capacity input/output devices (IOs) has led to the development of higher data rate wireline transmitters and receivers. Transceivers these days have time interleaved analog-to-digital converters (ADCs) and digital-to-analog converters (DACs), both of which employ multiphase sampling.

BRIEF DESCRIPTION OF THE DRAWINGS

Reference will now be made to the accompanying drawings, which are not necessarily drawn to scale, and wherein.

DETAILED DESCRIPTION

Figure 1:
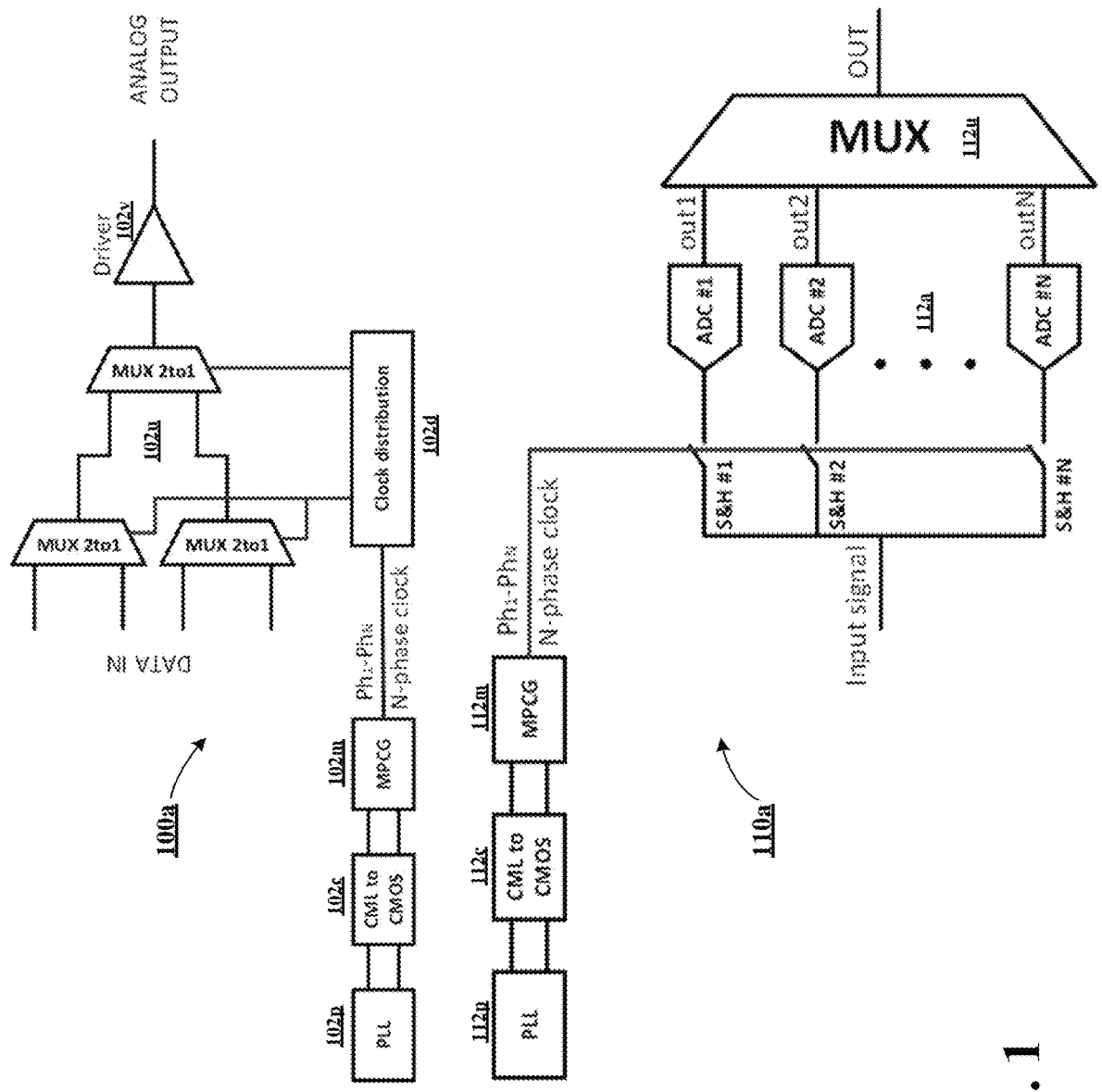
FIG. 1 shows example transceiver architectures that employ multiphase clock generators (MPCGs), in accordance with various aspects described herein.

FIG. 1 shows example transceiver architectures that employ multiphase clock generators (MPCGs). Example architecture 100a may be a time interleaved DAC that receives digital inputs via "DATA IN" lines and outputs an analog signal. As depicted, architecture 100a may include a phase locked loop (PLL) 102p that generates a high frequency, low jitter clock (clock generation), a Current Mode Logic (CML) to Complementary Metal-Oxide-Semiconductor (CMOS) logic block 102c that functions as an interface between two logic families, various layers of multiplexers 102u to facilitate the interleaving, a driver 102v for driving the output signal, an MPCG 102m that generates multiple N-phase clocks from the PLL output, and a clock distribution block 102d that distributes generated clocks for controlling the multiplexers 102u. Similarly, example architecture 110a may be a time interleaved ADC that receives an analog input via an "Input signal" line and outputs a digital signal. As depicted, architecture 110a may include a PLL 112p that generates a high frequency, low jitter clock (clock generation), a CML to CMOS block 112c that functions as an interface between two logic families, various layers of sub-ADCs 112a, a multiplexer 112u, and an MPCG 112m that generates multiple N-phase clocks from the PLL output for sampling (i.e., sampling and holding (S&H)) the sub-ADCs 112a.

Various devices can be used to generate clocks. For instance, polyphase filters can generate multiple clocks (e.g., 4-phase or 8-phase clocks) within a narrow frequency range. However, these filters suffer from poor phase accuracy. Delay-locked loops (DLLs) can generate clocks over a wide frequency range with relatively good phase accuracy, but require the use of matching dummies—i.e., devices that are added for the purpose of improving matching and symmetry. Ring oscillators have identical loading and clocks in all stages and can generate evenly-spaced multiphase clocks. 8-phase, 16-phase, and 32-phase ring oscillators are widely used. Injection-locked ring oscillators can be used as multiphase clock generators, multiphase clock multipliers, and multiphase clock dividers. However, existing ring oscillators are prone to phase mismatch as compared to DLLs, due to their requirement of a one oscillation period steady-state delay around the loop. In a typical ring oscillator, the relationship between oscillation frequency $f_{osc}$, number of delay stages N, and propagation delay $t_d$ per stage can be expressed as follows:

$$f_{osc} = \frac{1}{2Nt_d}.$$

To produce a greater number of clocks, the number of stages can be increased, although that is generally dictated by design and specification requirements. Such an increase can also reduce the oscillation frequency, which is not desired in high data rate systems. To otherwise increase the oscillation frequency of a ring oscillator, the propagation delay can be reduced or minimized. One way to reduce the propagation delay is to increase the supply voltage. However, this is not practical in low voltage applications, such as those that operate at sub-1 volt (V). Other techniques require changes to underlying CMOS technology. In any case, current ring oscillators suffer from limited speeds as well as ambiguity in the output state, which generally requires a reset mechanism.

The subject disclosure describes illustrative embodiments for increasing or boosting the oscillation frequency of a frequency divider, such as a multiphase ring oscillator-based clock divider. In exemplary embodiments, differential inverters, which may be used as building blocks of a frequency divider, may be configured with feedforward elements in a manner that increases or boosts the oscillation frequency of the divider. Example feedforward elements include resistors, capacitors, transmission gates, and inverters. Various example implementations of the differential inverter are described in more detail below.

One or more aspects of the subject disclosure include a frequency divider, comprising a plurality of delay devices arranged to receive input clocks and generate output clocks, wherein one or more of the delay devices comprises a first transconductance element configured to receive a first input and provide a first output, a second transconductance element configured to receive a second input and provide a second output, a first feedforward transconductance element that cross couples the first input and the second output, and a second feedforward transconductance element that cross couples the second input and the first output.

One or more aspects of the subject disclosure include a delay device, comprising a first transconductance element configured to receive a first input and provide a first output, a second transconductance element configured to receive a second input and provide a second output, a first feedforward transconductance element that cross couples the first input and the second output, and a second feedforward transconductance element that cross couples the second input and the first output.

One or more aspects of the subject disclosure include a method. The method may include arranging a first feedforward transconductance element to cross couple an input of a first transconductance element of a delay device and an output of a second transconductance element of the delay device, and arranging a second feedforward transconductance element to cross couple an input of the second transconductance element and an output of the first transconductance element.

Configuring a delay device (or delay element), such as a differential inverter, with feedforward elements, as described herein, boosts the 3 decibel (dB) bandwidth of the device, which advantageously reduces overall divider propagation delay and increases oscillation frequency. Lower voltages generally result in slower speeds. By implementing feedforwarding, as described herein, high oscillation frequencies can be achieved even in low voltage applications (e.g., <650 mV). Feedforward elements used in exemplary embodiments are also smaller than main delay cells, and thus provide a low cost solution for achieving such high oscillation frequency division. Furthermore, exemplary embodiments are also well suited for high data rate applications (e.g., 150 giga samples (Gs)/s and beyond). As will be understood and appreciated, exemplary feedforwarding techniques can be leveraged to facilitate various types of applications, such as time interleaved ADCs, time interleaved DACs, Serializer/Deserializer (SerDes) components, multiphase clock generation and distribution, and so on.

Figure 2A:
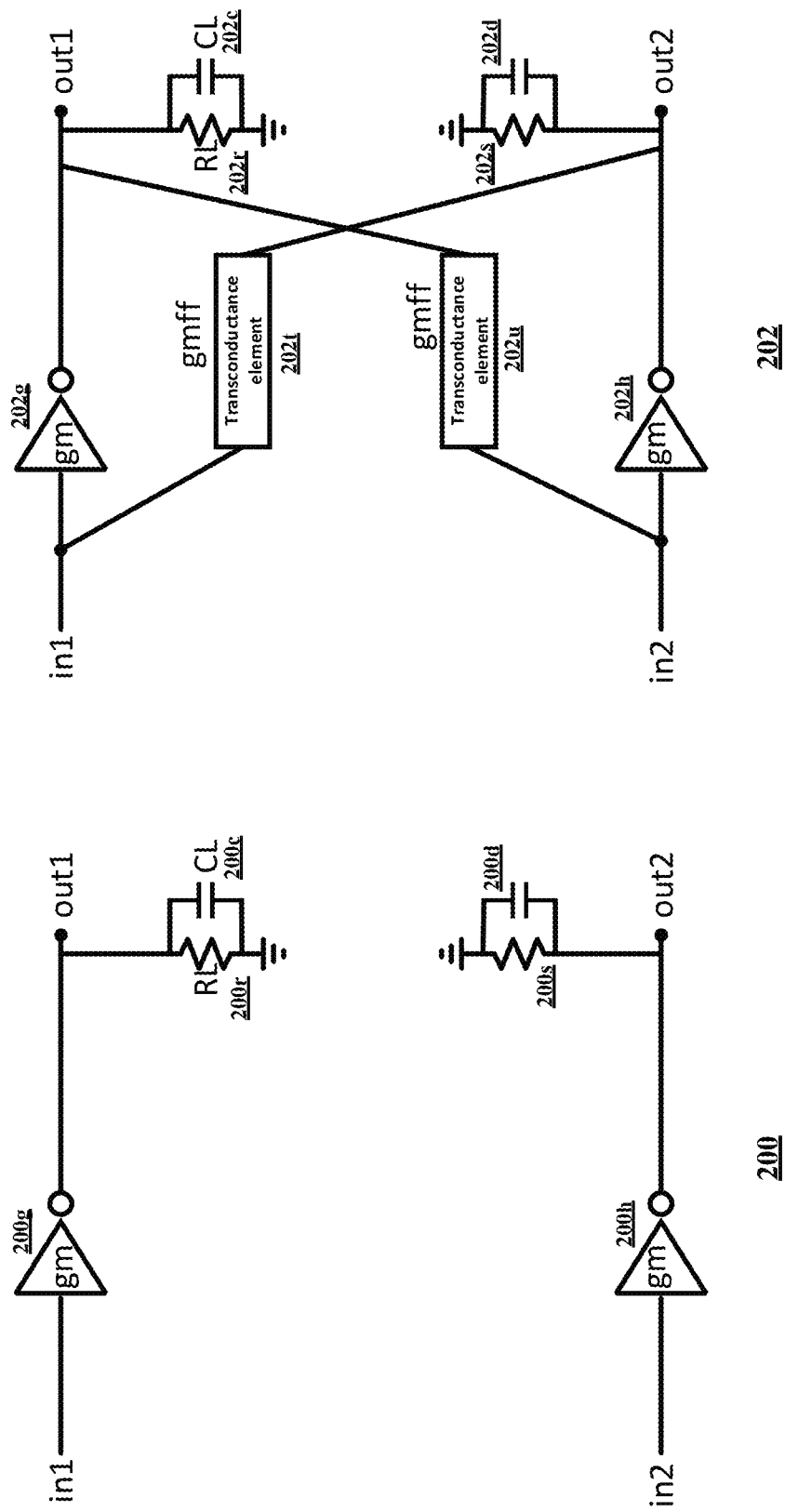
FIG. 2A shows circuit diagrams of a conventional, pseudo differential delay device and an example, non-limiting embodiment of a differential inverter with feedforwarding components.

Reference will now be made to FIG. 2A to illustrate the issue with conventional differential inverters (which are the main building blocks of ring-based frequency dividers) and the development of exemplary solutions to address the issue. FIG. 2A shows circuit diagrams of a conventional, pseudo differential delay device 200 (i.e., a differential inverter) and an example, non-limiting embodiment of a differential inverter 202 with feedforwarding components. As shown in FIG. 2A, the differential inverter 200 may include a transconductance element ($g_m$) 200g that receives an input IN1 and provides an output OUT1 that is coupled to a parallel RC circuit (200r, 200c). Further, the differential inverter 200 may also include a transconductance element 200h that receives an input IN2 and provides an output OUT2 that is coupled to another parallel RC circuit (200s, 200d). The transconductance elements 200g and 200h may each model a transistor's transconductance—i.e., measure of the change in output current in response to a change in input voltage.

In comparison, the differential inverter 202 of FIG. 2A may similarly include transconductance elements and parallel RC circuits (202g. 202r, and 202c and 202h, 202s, and 202d), but may also include additional feedforward transconductance ($g_m$ff) elements 202t and 202u. As depicted, the feedforward elements 202t and 202u may cross couple the inputs and outputs of the transconductance elements 202g and 202h, which effectively provides a cross coupling of impedance. This increases or boosts the operating frequency of the differential inverter 202 as compared to that of the differential inverter 200. Constructing a ring-oscillator-based frequency divider using multiple differential inverters 202 (rather than differential inverters 200) can thereby also increase or boost the oscillating frequency (as well as output frequencies) of the overall divider.

An examination of the poles and zeros in the complex plane for an RC network with transconductance $g_m$ can illuminate the effect provided by feedforward elements 202t and 202u. Specifically, an RC network with transconductance $g_m$ is a single pole system, where the transfer function (or gain) of the system can be determined by, for instance, dividing $g_m$ by (1+pole*ω), and where the frequency response of the system (e.g., 3 dB bandwidth or gain bandwidth) is defined by the single pole (e.g., a drop off at 20 dB decay). The frequency response of the system can be modified by adding a zero into the transfer function to obtain a zero (or near zero) slope (about 0 dB decay), such that a new dominant pole exists at higher frequencies. Specifically, in the differential inverter 202, the cross coupling provided by the feedforward transconductance elements 202t and 202u add or introduce a zero, i.e., $ω_z$, into the transfer function, which reduces or cancels out the pole, i.e., $ω_p=ω_z$. This effectively increases the bandwidth or gain bandwidth of the overall differential inverter, which results in a smaller propagation delay and thus higher oscillation frequency.

Figure 2B:
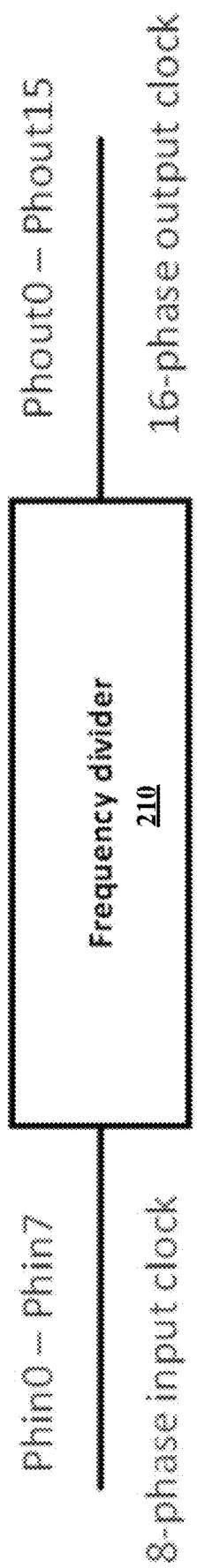
FIG. 2B is a diagram of an example 8-to-16 frequency divider in accordance with various aspects described herein.
Figure 2C:
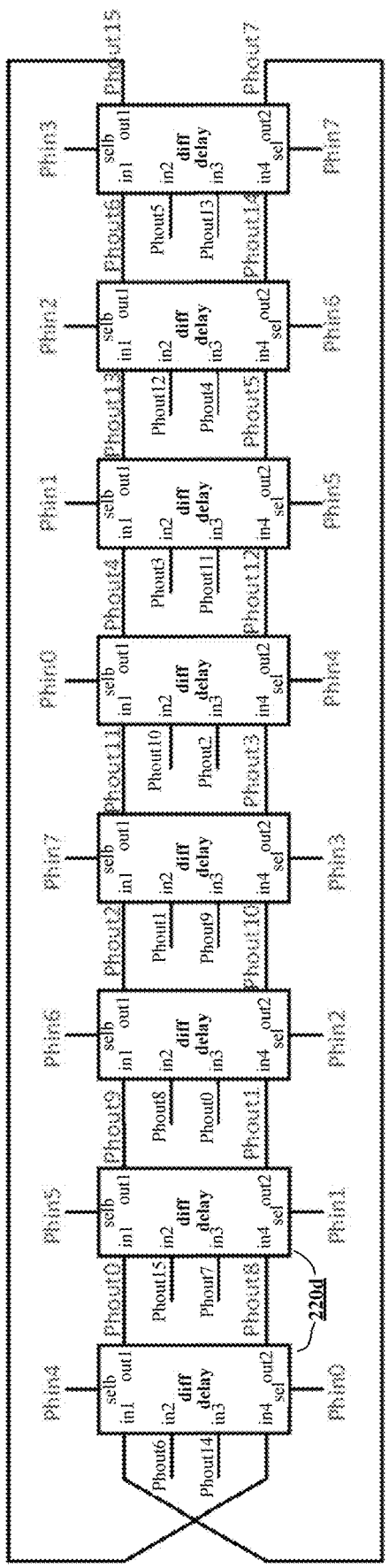
FIG. 2C is a diagram of an example ring oscillator-based implementation of the frequency divider of FIG. 2B, in accordance with various aspects described herein.

FIG. 2B is a diagram of an example 8-to-16 frequency divider 210 in accordance with various aspects described herein. The frequency divider 210 may be constructed using various components that, together, receive 8 clocks of different phases and provide 16 clocks of different phases. It is to be understood and appreciated that, while 8-to-16 division is shown and described, a frequency divider may be configured with any suitable or desired number of phases or stages. FIG. 2C is a diagram of an example ring oscillator-based implementation 220 of the frequency divider 210 of FIG. 2B in accordance with various aspects described herein. The ring oscillator structure 220 may include a series of differential delay devices 220d each having four inputs and two outputs, where certain of their inputs and outputs are coupled as shown in FIG. 2C. In various embodiments, the ring oscillator structure 220 may be included in or correspond to the clock distribution block 102d of architecture 100a in FIG. 1. In some embodiments, the ring oscillator structure 220 may be included in or correspond to either of the MPCG blocks 102m. 112m shown in FIG. 1. In these embodiments, the PLL may run at a high frequency and an additional MPCG or the like (not shown, but that can divide 2-to-8, for instance) may be utilized after the PLL to derive the input phases for the MPCG shown.

Figure 2D:
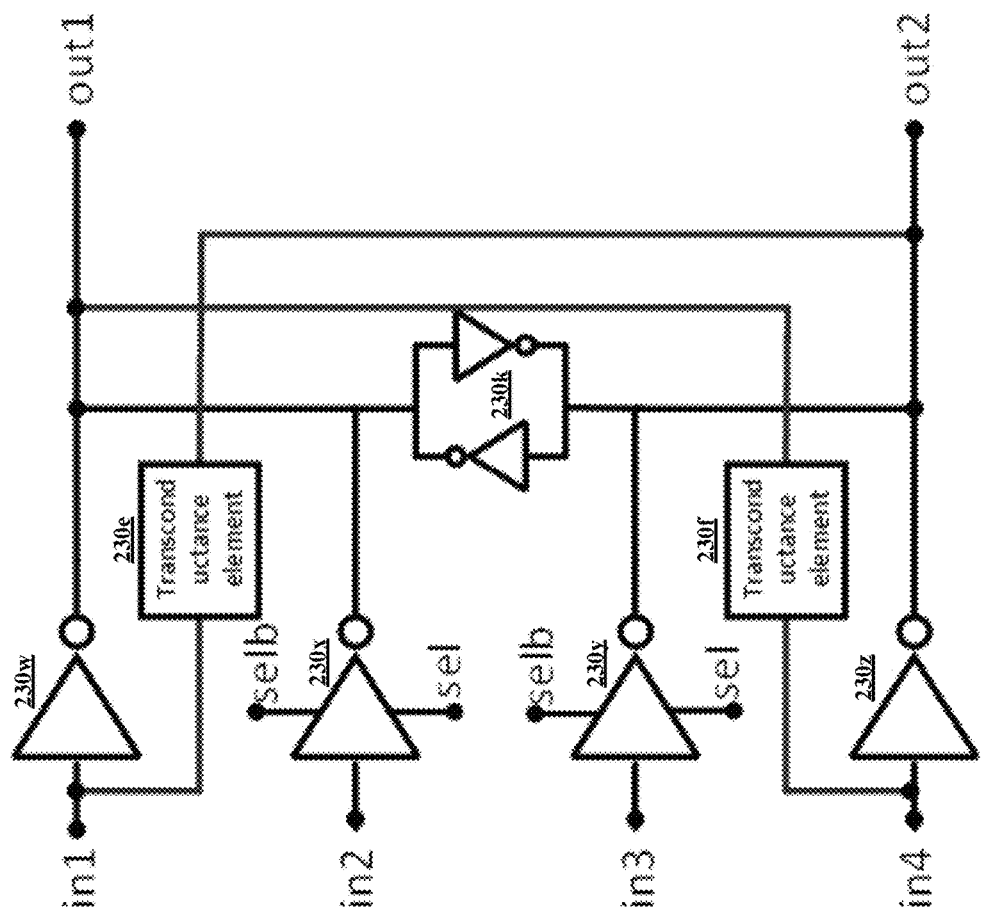
FIG. 2D is a circuit diagram of an example, non-limiting embodiment of a differential inverter equipped with feedforwarding components for speed boosting, in accordance with various aspects described herein.

In exemplary embodiments, the general feedforward technique discussed above with respect to the differential inverter 202 of FIG. 2A may be employed in the differential delay devices 220d of the ring-oscillator structure 220. FIG. 2D is a circuit diagram of an example, non-limiting embodiment of a differential inverter 230 equipped with feedforwarding components for speed boosting, in accordance with various aspects described herein. In exemplary embodiments, an instance of the differential inverter 230 may be included in or correspond to one or more differential delay device 220d (e.g., each differential delay device 220d) of the ring-oscillator structure 220 of FIG. 2C. As shown in FIG. 2D, the differential inverter 230 may include transconductance elements 230w, 230x, 230y, and 230z that respectively receive inputs IN1, IN2, IN3, and IN4. Each of the transconductance elements 230w, 230x, 230y, and 230z may comprise any suitable component that provides a transconductance. Further, some or all of the transconductance elements 230w, 230x, 230y, and 230z may include control inputs (sel, selb) that are tied to ground/supply as needed per design requirements. As depicted, the outputs of the transconductance elements 230w and 230x may be connected to provide output OUT1, the outputs of transconductance elements 230y and 230z may be connected to provide output OUT2, and a parallel circuit 230k of inverters may separate OUT1 and OUT2. The differential inverter 230 may also include a feedforward transconductance element 230e that cross couples input IN1 with output OUT2, and a feedforward transconductance element 230f that cross couples input IN4 with output OUT1. Inclusion of such feedforward components advantageously increases or boosts the bandwidth or gain bandwidth of the differential inverter, which results in a smaller propagation delay. This allows for a higher oscillation frequency in a frequency divider that is constructed from multiple differential inverters 230.

Figure 2E:
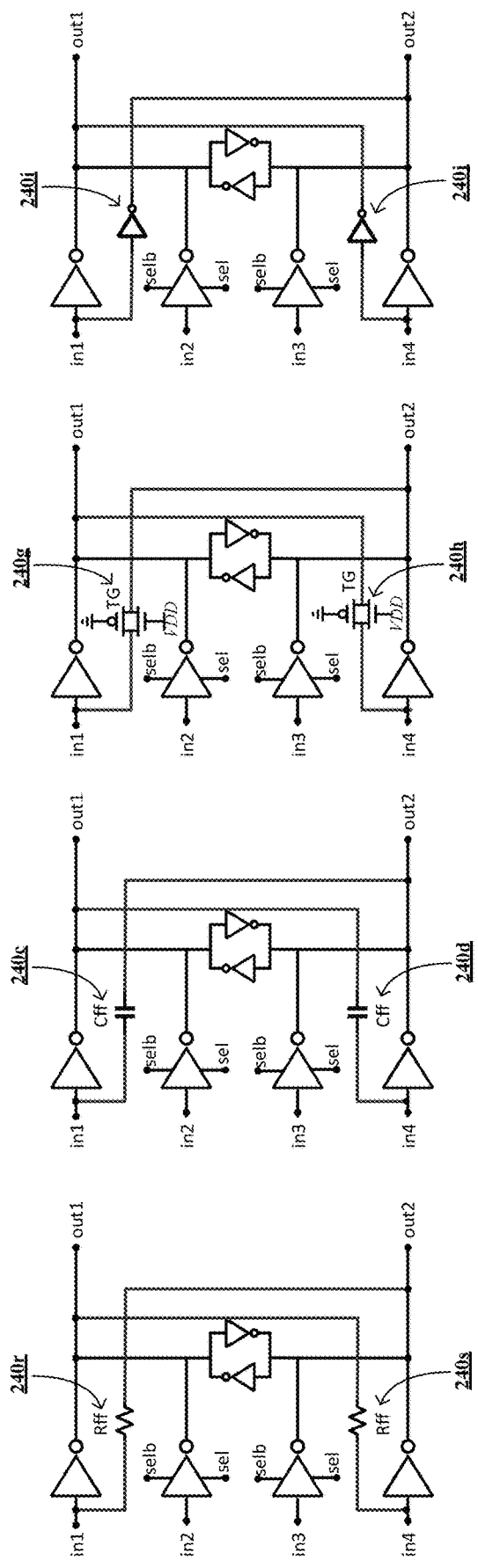
FIG. 2E shows circuit diagrams of various example, non-limiting implementations of the differential inverter of FIG. 2D using different types of feedforward components, in accordance with various aspects described herein.

Different approaches can be taken to realize the feedforward compensation paths for loading the outputs OUT1 and OUT2 in FIG. 2D. FIG. 2E shows circuit diagrams of various example, non-limiting implementations of the differential inverter 230 of FIG. 2D using different types of feedforward components. As shown in FIG. 2E, the feedforward elements may be resistors 240r, 240s, capacitors 240c, 240d, transmission gates 240g, 240h, or inverters 240i, 240j. Other types of components that provide electrical resistance may alternatively be used. The resistance or capacitance values associated with these components may be chosen depending on the operating frequency or frequency range of the desired divider. For instance, the resistance of a transmission gate may be anywhere from 100Ω to 1kΩ. In some embodiments, the values may also depend on other implementation constraints (e.g., on-chip limitations). In practice, the choice of feedforward component type may depend on the type of load involved. For instance, in a case where an RC load is involved, it may be more appropriate to employ resistors, transmission gates, or inverters as the feedforward components. As another example, in a case where a fully capacitive load is involved (i.e., where the direct current (DC) operating point is not to be altered), it may be more appropriate to employ capacitors as the feedforward components. In some implementations, different types of feedforward transconductance elements may be used in a differential inverter. As an example, a resistor may be used as the feedforward element for one branch of the differential inverter, but a transmission gate may be used as the feedforward element for another branch of the differential inverter. For the device to work as intended, these feedforward elements may need to be implemented such that they both have same resistance. This may or may not be practical (although not impossible) since controlling and equalizing the resistance of different feedforward elements may be difficult. Of course, such a design would also be asymmetrical, which may or may not be desirable depending on design requirements.

Figure 2F:
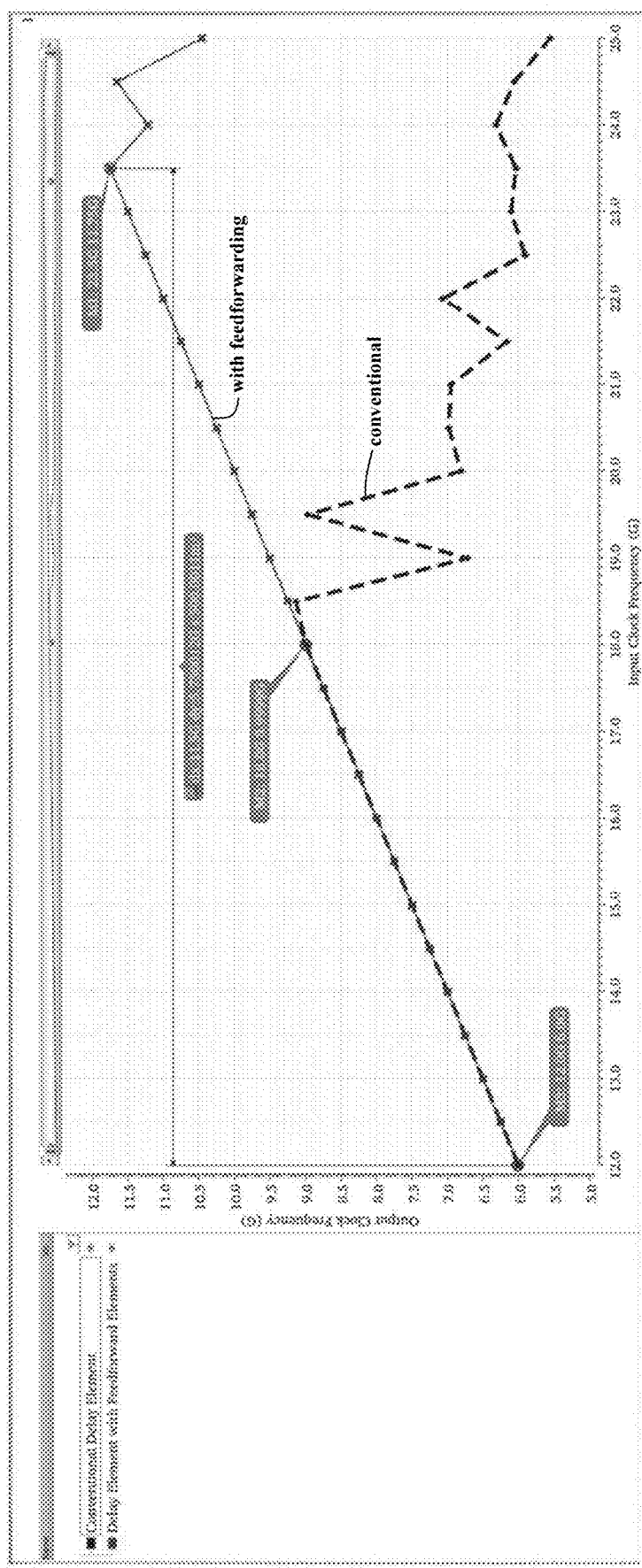
FIG. 2F shows example simulation results illustrating the output frequency as a function of the input frequency for a frequency divider implemented using conventional delay devices versus an example, non-limiting frequency divider implemented using feedforward components.
Figure 2G:
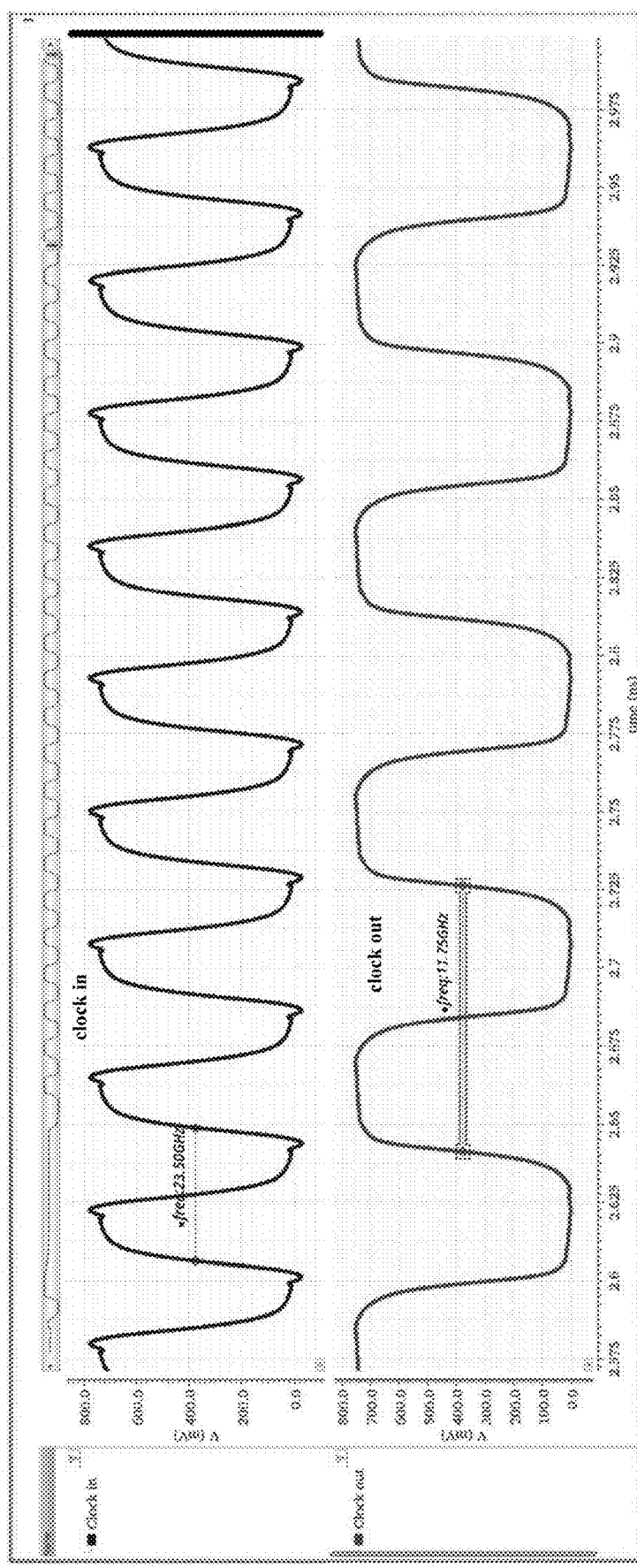
FIG. 2G shows the input and output clocks of an example, non-limiting embodiment of a frequency divider at the maximum frequency of the divider, in accordance with various aspects described herein.

FIG. 2F shows example simulation results illustrating the output frequency as a function of the input frequency for a frequency divider implemented using conventional delay devices versus an exemplary frequency divider implemented using feedforward components. FIG. 2G shows the input and output clocks of the exemplary frequency divider at the maximum frequency of the divider. In simulation, transmission gates were used as the feedforward components. As shown in FIG. 2F, the frequency divider implemented using conventional delay devices fails at frequencies above 18 gigahertz (GHz), whereas the exemplary frequency divider can operate at as high as 23.5 GHZ.

It is to be understood and appreciated that, although one or more of FIGS. 1 and 2A-2E might be described above as pertaining to various processes and/or actions that are performed in a particular order, some of these processes and/or actions may occur in different orders and/or concurrently with other processes and/or actions from what is depicted and described above. Moreover, not all of these processes and/or actions may be required to implement the systems and/or methods described herein. Furthermore, while various elements, components, devices, systems, modules, circuits, etc. may have been illustrated in one or more of FIGS. 1 and 2A-2E as separate elements, components, devices, systems, modules, circuits, etc., it will be appreciated that multiple elements, components, devices, systems, modules, circuits, etc. can be implemented as a single element, component, device, system, module, circuit, etc., or a single element, component, device, system, module, circuit, etc. can be implemented as multiple elements, components, devices, systems, modules, circuits, etc. Additionally, functions described as being performed by one element, component, device, system, module, circuit, etc. may be performed by multiple elements, components, devices, systems, modules, circuits, etc., or functions described as being performed by multiple elements, components, devices, systems, modules, circuits, etc. may be performed by a single element, component, device, system, module, circuit, etc.

Figure 3:
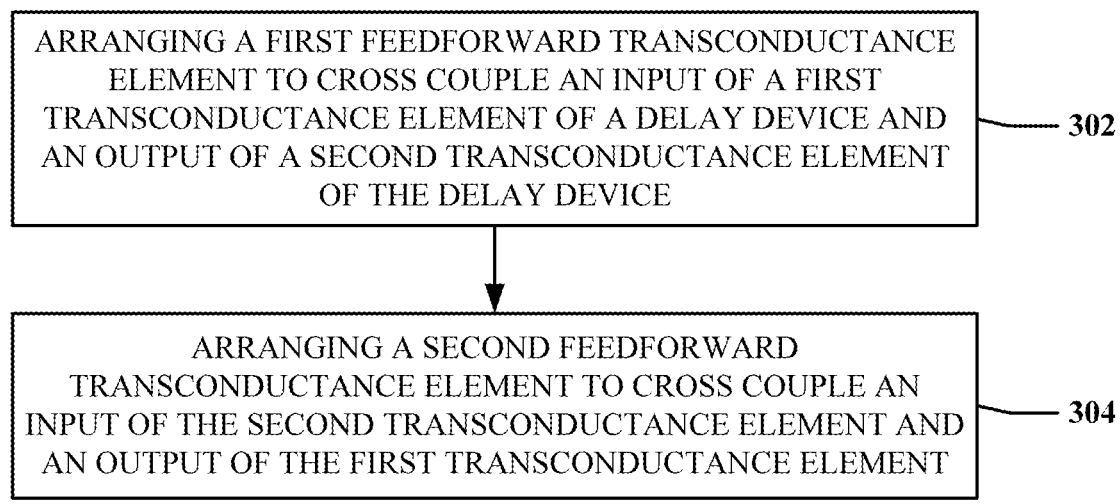
FIG. 3 depicts an illustrative embodiment of a method in accordance with various aspects described herein.

FIG. 3 depicts an illustrative embodiment of a method 300 in accordance with various aspects described herein.

At 302, the method can include arranging a first feedforward transconductance element to cross couple an input of a first transconductance element of a delay device and an output of a second transconductance element of the delay device. For example, with reference to FIG. 2D, the method can include arranging the feedforward transconductance element 230e to cross couple input IN1 of the transconductance element 230w of the delay device 230 and output OUT2 of the transconductance element 230z of the delay device 230.

At 304, the method can include arranging a second feedforward transconductance element to cross couple an input of the second transconductance element and an output of the first transconductance element. For example, with reference to FIG. 2D, the method can include arranging the feedforward transconductance element 230f to cross couple input IN4 of the transconductance element 230z and output OUT1 of the transconductance element 230w.

In this way, the operating bandwidth of the delay device may be increased, thereby reducing its propagation delay and overall operating frequency.

While for purposes of simplicity of explanation, the respective processes are shown and described as a series of blocks in FIG. 3, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim. It is also to be understood and appreciated that the subject matter in one or more dependent claims may be combined with that in one or more other dependent claims.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data. Computer-readable storage media can comprise the widest variety of storage media including tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A frequency divider, comprising:
   a plurality of delay devices arranged to receive input clocks and generate output clocks, wherein one or more of the delay devices comprise
   a first transconductance element configured to receive a first input and provide a first output,
   a second transconductance element configured to receive a second input and provide a second output,
   a first feedforward transconductance element that cross couples the first input and the second output, and
   a second feedforward transconductance element that cross couples the second input and the first output, wherein cross coupling provided by the first feedforward transconductance element and the second feedforward transconductance element increases an oscillation frequency of the frequency divider.

2. The frequency divider of claim 1, wherein one or more of the first and second feedforward transconductance elements comprise a resistor.

3. The frequency divider of claim 1, wherein one or more of the first and second feedforward transconductance elements comprise a capacitor.

4. A frequency divider, comprising:
   a plurality of delay devices arranged to receive input clocks and generate output clocks, wherein one or more of the delay devices comprise
   a first transconductance element configured to receive a first input and provide a first output,
   a second transconductance element configured to receive a second input and provide a second output,
   a first feedforward transconductance element that cross couples the first input and the second output, and
   a second feedforward transconductance element that cross couples the second input and the first output, wherein one or more of the first and second feedforward transconductance elements comprise a transmission gate.

5. The frequency divider of claim 1, wherein one or more of the first and second feedforward transconductance elements comprise an inverter.

6. The frequency divider of claim 1, wherein the cross coupling increases a bandwidth associated with a corresponding delay device, thereby reducing a propagation delay of the corresponding delay device.

7. A frequency divider, comprising:
a plurality of delay devices arranged to receive input clocks and generate output clocks, wherein one or more of the delay devices comprise
   a first transconductance element configured to receive a first input and provide a first output,
   a second transconductance element configured to receive a second input and provide a second output,
   a first feedforward transconductance element that cross couples the first input and the second output,
   a second feedforward transconductance element that cross couples the second input and the first output,
   a third transconductance element that receives a third input, and
   a fourth transconductance element that receives a fourth input,
      wherein a third output of the third transconductance element is coupled to the first output, and
      wherein a fourth output of the fourth transconductance element is coupled to the second output.

8. The frequency divider of claim 7, wherein one or more of the delay devices further comprise a pair of inverters coupled in parallel and separating the third output and the fourth output.

9. The frequency divider of claim 1, wherein the frequency divider is of a ring oscillator type.

10. The frequency divider of claim 1, wherein the frequency divider is employed to provide the output clocks for one or more time interleaved analog-to-digital converters (ADCs), one or more time interleaved digital-to-analog converters (DACs), one or more Serializer/Deserializer (SerDes) components, or a combination thereof.

11. A delay device, comprising:
a first transconductance element configured to receive a first input and provide a first output;
a second transconductance element configured to receive a second input and provide a second output;
a first feedforward transconductance element that cross couples the first input and the second output; and
a second feedforward transconductance element that cross couples the second input and the first output, wherein one or more of the first and second feedforward transconductance elements comprise a transmission gate.

12. The delay device of claim 11, wherein one or more of the first and second feedforward transconductance elements comprise a resistor.

13. The delay device of claim 11, wherein one or more of the first and second feedforward transconductance elements comprise a capacitor.

14. The delay device of claim 11, wherein one or more of the first and second feedforward transconductance elements comprise an inverter.

15. A method, comprising:
arranging a first feedforward transconductance element to cross couple an input of a first transconductance element of a delay device and an output of a second transconductance element of the delay device; and
arranging a second feedforward transconductance element to cross couple an input of the second transconductance element and an output of the first transconductance element, wherein the arranging the first feedforward transconductance element and the arranging the second feedforward transconductance element enable a reduction in a propagation delay associated with the delay device.

16. The method of claim 15, wherein one or more of the first and second feedforward transconductance elements comprise a resistor.

17. The method of claim 15, wherein one or more of the first and second feedforward transconductance elements comprise a capacitor.

18. The method of claim 15, wherein one or more of the first and second feedforward transconductance elements comprise a transmission gate.

19. The method of claim 15, wherein one or more of the first and second feedforward transconductance elements comprise an inverter.

20. The delay device of claim 11, wherein cross coupling provided by the first feedforward transconductance element and the second feedforward transconductance element increases an oscillation frequency associated with the delay device.

* * * * *